United States Patent
Ohnishi et al.

(10) Patent No.: US 6,847,062 B2
(45) Date of Patent: Jan. 25, 2005

(54) SEMICONDUCTOR DEVICE

(75) Inventors: Teruhito Ohnishi, Osaka (JP);
Koichiro Yuki, Kyoto (JP); Shigeki Sawada, Kyoto (JP); Keiichiro Shimizu, Nara (JP); Koichi Hasegawa, Hyogo (JP); Tohru Saitoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/413,305

(22) Filed: Apr. 15, 2003

(65) Prior Publication Data
US 2004/0065875 A1 Apr. 8, 2004

(30) Foreign Application Priority Data
Oct. 4, 2002 (JP) ........................................ 2002-292662

(51) Int. Cl.⁷ .................... H01L 31/0328; H01L 29/00
(52) U.S. Cl. .................... 257/197; 257/19; 257/198; 257/564; 257/588; 438/235; 438/309; 438/312; 438/317
(58) Field of Search .................... 257/19, 197–198, 257/564, 191, 588, 592, 616; 438/235, 309, 312, 317

(56) References Cited

U.S. PATENT DOCUMENTS 6,570,241 B2 * 5/2003 Hashimoto .................. 257/592

2002/0163013 A1 * 11/2002 Toyoda et al. .............. 257/197

FOREIGN PATENT DOCUMENTS

| EP | 1 065 728 A2 | 1/2001 |
| JP | P2001-332563 A | 11/2001 |
| JP | P2002-158232 A | 5/2002 |

OTHER PUBLICATIONS

L. D. Lanzerotti et al., "Suppression of Boron Outdiffusion in SiGe HBTs by Carbon Incorporation", IEDM Technical Digest, pp. 249–252, 1996.

D. Knoll et al., "Si/SiGe:C Heterojunction Bipolar Transistors in an Epi–Free Well, Single–Polysilicon Technology", IEEE, 1998.

* cited by examiner

Primary Examiner—Donghee Kang
(74) Attorney, Agent, or Firm—McDermott Will & Emery LLP

(57) ABSTRACT

In a semiconductor device functioning as a SiGeC-HBT, an emitter/base stacked portion 20 is formed on a Si epitaxially grown layer 2. The emitter/base stacked portion 20 includes: a SiGeC spacer layer 21; a SiGeC core base layer 22 containing boron at a high concentration, a SiGe cap layer 23; a Si cap layer 24, and an emitter layer 25 formed by introducing phosphorus into the Si cap layer 24 and the SiGe cap layer 23.

16 Claims, 11 Drawing Sheets

| Samples | $h_{FE}$ | Variations in $h_{FE}$ | Direct-on cap | C content in base |
|---|---|---|---|---|
| 1 | 321 | 60.5% | Si | 0.2% |
| 2 | 254 | 56.5% | Si | 0.8% |
| 3 | 510 | 38.0% | 8%SiGe | 0.8% |
| 4 | 2791 | 61.1% | 15%SiGe | 0.2% |
| 5 | 226 | 19.9% | 15%SiGe | 0.5% |
| 6 | 577 | 24.3% | 15%SiGe | 0.8% |

US 6,847,062 B2

SEMICONDUCTOR DEVICE

BACKGROUND OF THE INVENTION

The present invention relates to semiconductor devices and more particularly relates to a SiGeC hetero-bipolar transistor (SiGeC-HBT) whose composition is expressed by the chemical formula $Si_{1-x-y}Ge_xC_y$ (hereinafter also referred to simply as "SiGeC").

In recent years, as wireless communication equipment such as mobile telephones and wireless LANs has come to be extensively used in our daily life, high-frequency ICs have come into increasing demand. Conventionally, semiconductor devices capable of operating in high-frequency regions have been difficult to fabricate without using high-cost compound-semiconductor processing technology. Thus, if such semiconductor devices could be fabricated using a silicon process, there would be a great advantage in terms of cost and integration. Bipolar transistors are, among various semiconductor devices, particularly necessary for analog amplification circuits used for wireless communication, and a bipolar transistor capable of operating at high frequency with low power consumption is thus being intensely sought.

In this regard, a hetero-bipolar transistor (SiGeC-HBT) whose core base layer is formed using a technique for epitaxially growing a SiGe:C crystal has recently become practicable as a means for achieving such a low-power-consumption bipolar transistor capable of high-frequency operation. The SiGeC-HBT has improved high-frequency characteristics because the base formed by such a technique can have a very small width, which results in reduction in the base transit time $\tau_F$.

FIG. 14A is a cross-sectional view schematically illustrating an exemplary structure of a known SiGeC-HBT, and FIG. 14B shows the profiles of Ge content, C content and impurity concentration in an emitter/base stacked portion therein.

As shown in FIG. 14A, the SiGeC-HBT includes a Si substrate 101, a Si epitaxially grown layer 102, deep trench isolations 103, a shallow trench isolation 104, a buried N+ layer 105, and a SIC (self-aligned implanted collector) layer 106. The Si epitaxially grown layer 102 is formed on the Si substrate 101 by epitaxial growth. The deep trench isolations 103, which surround an HBT region, are formed passing through the Si epitaxially grown layer 102 to reach part of the Si substrate 101. The shallow trench isolation 104 is formed in a portion of the Si epitaxially grown layer 102. The buried N+ layer 105, which contains an n-type impurity (such as arsenic (As)) at a high concentration, is formed across the boundary between the Si substrate 101 and the Si epitaxially grown layer 102. The SIC layer 106, which is in contact with the buried N+ layer 105, is formed by implanting ions of an n-type impurity (such as phosphorus (P)) into the Si epitaxially grown layer 102. Formed on a collector layer located within the Si epitaxially grown layer 102 over the SIC layer 106 is an emitter/base stacked portion 120 obtained by stacking SiGeC and Si layers.

As shown enlarged in the upper right of FIG. 14A, the emitter/base stacked portion 120 includes a SiGeC spacer layer 121, a SiGeC core base layer 122, a Si cap layer 123, and an emitter layer 125. The SiGeC spacer layer 121 is epitaxially grown on the Si epitaxially grown layer 102 (the collector layer). The SiGeC core base layer 122, which contains boron at a high concentration, is epitaxially grown on the SiGeC spacer layer 121. The Si cap layer 123 is epitaxially grown on the SiGeC core base layer 122. The emitter layer 125 is formed by doping the Si cap layer 123 with an n-type impurity (such as phosphorus (P)).

Further, an external base layer 111 is provided on the emitter/base stacked portion 120 laterally, and an insulating layer 113 and an emitter electrode 112 are provided on the emitter/base stacked portion 120. The insulating layer 113 surrounds an opening for the emitter, and the emitter electrode 112 is surrounded by the insulating layer 113 and in contact with the emitter layer 125 at the opening for the emitter. The emitter electrode 112 is made of polysilicon containing a high concentration of an n-type impurity, for example, phosphorus (P). The emitter layer 125 is formed by heat-treating the phosphorous (P) existing in the emitter electrode 112 to diffuse it into the Si cap layer 123. In addition, the upper portions of a collector wall layer 107 and the emitter electrode 112 are silicide layers 107a and 112a, respectively.

The structure of the SiGeC-HBT shown in FIG. 14A is an example of a known SiGeC-HBT. SiGeC-HBTs having a structure other than the structure shown in FIG. 14A have been proposed or made practicable. Nonetheless, SiGeC-HBTs typically have an emitter/base stacked portion such as shown in the upper right of FIG. 14A.

FIG. 14B shows a specific structural example of the emitter/base stacked portion in the SiGeC-HBT shown in the upper right of FIG. 14A. The example is described on p. 703 of an IEEE IEDM 98 article entitled "Si/SiGe:C Hetero-junction Bipolar Transistors in an Epi-Free Well, Single-Polysilicon Technology" (D. Knoll and ten others, Institute of Semiconductor Physics: IHP).

In FIG. 14B, the abscissa represents the depth from the upper surface of the Si cap layer 123, and the ordinate represents the Ge content (indicated by the solid line), the C content (indicated by the dashed line), and the B (boron) concentration (indicated by the dotted-dashed line), wherein the units (atoms/cm$^3$) used to express the boron concentration are different from the units (%) in which the Ge and C contents are expressed.

As indicated in FIG. 14B, the Ge content profile shows that the Ge content is substantially constant (about 25%) in the SiGeC spacer layer 121 and is graded in the SiGeC core base layer 122. Specifically, in the SiGeC core base layer 122, the Ge content is the same (about 25%) as in the SiGeC spacer layer 121 at the end portion that contacts the SiGeC spacer layer 121, and is the same (0%) as in the Si cap layer 123 at the end portion that contacts the Si cap layer 123. The C content profile shows that the C content is constant at a low level (about 0.1%) in the SiGeC spacer layer 121 and the SiGeC core base layer 122.

FIG. 15 is a diagram illustrating an energy band in a longitudinal section passing through the emitter/base junction in a SiGeC-HBT having the structure shown in FIG. 14B. While the SiGeC-HBT operates, a voltage positive with respect to the emitter layer 125 is applied to the SiGeC core base layer 122. Thus, the potential of the emitter layer 125 relatively increases, and as shown in FIG. 15, electrons e transit in a conduction band $E_c$ heading from the emitter layer 125 through the SiGeC core base layer 122 to the SiGeC spacer layer 121 (and then to the collector layer). At this time, the electrons can transit in the SiGeC core base layer 122 at higher speed because the SiGeC core base layer 122 has a gradient composition and thus a gradient potential.

Generally, when a SiGe layer is epitaxially grown on a Si layer, a relatively large strain is caused in the SiGe layer because Ge atoms have a greater lattice constant than Si atoms. The bandgap $E_g$ of the SiGe layer under such a strain becomes smaller than that of the Si layer. Specifically, the bandgap of the SiGe layer normally decreases by about 7.5 meV for every percent Ge in the composition. To exploit this, in a SiGe-HBT, Ge content in the core base layer is gradually increased heading toward the collector side, thereby grading the Ge profile. When the Ge profile is graded such that the Ge content in the core base layer is gradually increased heading toward the collector side, the potential of the conduction band $E_c$ of the core base layer decreases gradually in the direction heading from the emitter side to the collector side. Accordingly, electrons passing through the base can be accelerated so as to reach the collector quickly, resulting in increase in operating speed of the device. Further, the fact that the core base layer contains Ge makes the bandgap $E_g$ smaller. Thus, even if a voltage $V_{be}$ applied to the core base layer is lower, a large amount of a collector current $I_c$ flows and then the base current $I_b$ relatively decreases. Thus, the current gain $h_{FE}$ increases. As a result, even if the concentration of an impurity (such as boron) is increased in the core base layer, the current gain $h_{FE}$ does not decrease that much. Thus, with the current gain $h_{FE}$ kept at a high level, the base resistance can be reduced. Described above are the basic advantages of a SiGe heterobipolar transistor (SiGe-HBT).

On the other hand, advantages of forming a SiGeC core base layer by having the core base layer contain carbon (C) are as follows. In an npn bipolar transistor in which the base layer is doped with boron, there is a problem in that boron diffusion in the SiGe core base layer causes the base resistance to be increased, or the base width to be enlarged, leading to a longer traveling time of the electrons in the base. Because of the boron diffusion due to thermal enhanced diffusion (TED) occurring during heat treatment, it is difficult to make the base width 20 nm or less, for example. Nevertheless, such heat treatment is absolutely necessary for activating the impurity. Further, in order to make the base width small, the impurity concentration has to be high so that punch-though is prevented and the base resistance is reduced. Specifically, making the base width 20 nm or less, for example, requires the boron concentration to be $1 \times 10^{19}$ atoms/cm$^3$ or higher.

Boron diffusion can be controlled by having the SiGe layer contain carbon (C). Thus, the formation of a SiGeC core base layer allows a high concentration of boron to be confined in the small-width base even after heat treatment has been carried out. It has been found that carbon acts effectively when contained at a content of about 0.1% or more. In other words, boron diffusion can be controlled in a SiGeC core base layer, as a result of which the B concentration in the SiGeC core base layer can be kept at a high level.

With the example in the journal article mentioned above, since the SiGeC core base layer 122 contains carbon (C) at about $10^{20}$ atoms/cm$^3$ (about 0.1%), it is possible to reduce the width of the base such that the base transit time $\tau_f$ can be shortened, thus allowing high-speed operation. For example, high-speed operation enabling a cutoff frequency fT$_{max}$ of 65 GHz and a maximum oscillation frequency f$_{max}$ of about 90 GHz has been achieved.

However, the known SiGeC-HBT having the emitter/base stacked portion disclosed in the foregoing journal article also has the following drawbacks.

Generally, as for a vast majority of circuits, such as differential amplifiers used in wireless communication equipment, variations in the current gain $h_{FE}(\beta)$ have to be small among the HBTs included in a circuit. However, in the above-mentioned known SiGeC-HBT, it is difficult to sufficiently reduce variations in the current gain $h_{FE}$. The current gain $h_{FE}$ is the ratio between the collector current $I_c$ and the base current $I_b$. After the emitter/base stacked portion has been formed by an UHV-CVD or like epitaxial growth process, the surface of the stacked portion is cleaned before a polysilicon film, which acts as the emitter electrode, is deposited on the emitter/base stacked portion. After this cleaning process, or while the polysilicon is grown in a CVD chamber at high temperature, a poor SiO$_2$ layer (native oxide film) is formed on the surface of the epitaxially grown layer (that is, the emitter/base stacked portion). The ununiformity of the thickness of the native oxide film formed at the interface between the Si cap layer of the emitter/base stacked portion and the emitter electrode results in variations in the diffusion for forming the emitter, hole barriers formed by the native oxide film itself, and other ununiformity. And the existence of such ununiformity causes large variations in the base current $I_b$, which turns out to be a principal cause of variations in the current gain $h_{FE}$.

SUMMARY OF THE INVENTION

It is therefore an object of the present invention to suppress variations in the current gain resulting from ununiformity in native-oxide-film thickness while maintaining the current gain at a relatively high level in a semiconductor device functioning as a SiGeC-HBT including an emitter/base stacked portion.

An inventive semiconductor device includes: a Si layer functioning as a collector layer and a semiconductor layer formed over the Si layer and functioning as an emitter layer and as a base layer, wherein the semiconductor layer includes: a core base layer whose composition is expressed by $Si_{1-x1-y1}Ge_{x1}C_{y1}$ (wherein $0<x1<1$, $0.003 \leq y1<1$), and a direct-on cap layer which is formed on and in contact with the core base layer and whose composition is expressed by $Si_{1-x2-y2}Ge_{x2}C_{y2}$ (wherein $0<x2<1$, $0 \leq y2<y1$).

With the inventive semiconductor device, it is possible to reduce variations in the base current owing to such increase in the base current as is not affected by a native oxide film, and at the same time, to increase the collector current. Accordingly, it is possible to reduce variations in the current gain with the current gain maintained at a high level.

The C mole fraction y1 in the core base layer is preferably 0.015 or less.

The Ge mole fraction y2 in the direct-on cap layer is preferably 0.08 or less.

When the inventive semiconductor device further includes an emitter electrode formed over the semiconductor layer and made of polysilicon, variations in the current gain can be decreased even if the thickness of the native oxide film formed at the interface between the semiconductor layer and the emitter electrode of polysilicon is ununiform.

It is preferable that the semiconductor layer further includes a spacer layer which is interposed between the core base layer and the Si layer functioning as a collector layer and whose composition is expressed by $Si_{1-x3-y3}Ge_{x3}C_{y3}$ (wherein $0<x3<1$, $0 \leq y3<y1$).

It is preferable that the semiconductor layer further includes a Si cap layer that does not contain Ge on the cap layer and the emitter layer is formed in the Si cap layer or in a region passing through the Si cap layer to reach into the cap layer.

Part of the cap layer is preferably located in a depletion layer which has a built-in potential between the emitter and the base.

DESCRIPTION OF THE PREFERRED EMBODIMENTS (First Embodiment)

Structure of SiGeC-HBT

Figure 1A:
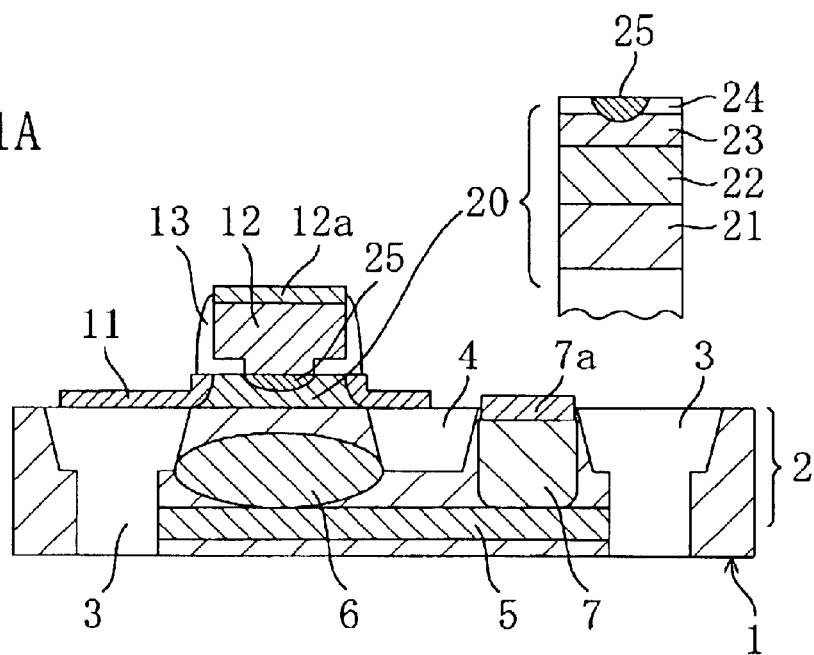
FIG. 1A is a cross-sectional view schematically illustrating an exemplary structure of a SiGeC-HBT according to a first embodiment of the present invention.
Figure 1B:
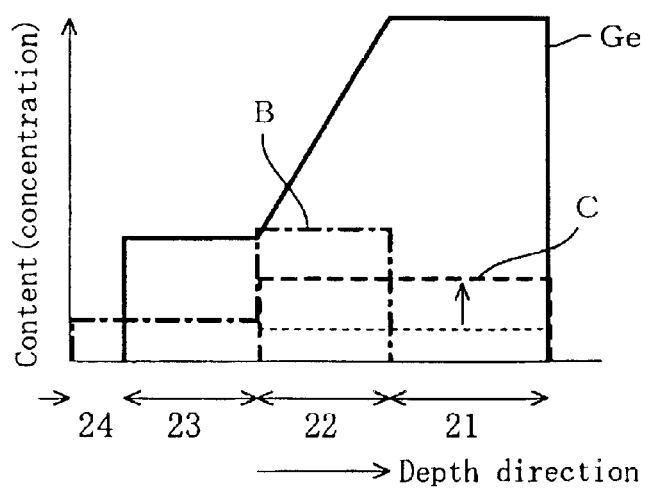
FIG. 1B is a graph showing profiles of Ge content, C content and impurity concentration in an emitter/base stacked portion therein.

FIG. 1A is a cross-sectional view schematically illustrating an exemplary structure of a SiGeC-HBT according to a first embodiment of the present invention, and FIG. 1B is a graph showing the profiles of Ge content, C content and impurity concentration in an emitter/base stacked portion in the SiGeC-HBT.

As shown in FIG. 1A, the SiGeC-HBT of this embodiment includes a Si substrate 1, a Si epitaxially grown layer 2, deep trench isolations 3, a shallow trench isolation 4, a buried $N^+$ layer 5, a SIC (self-aligned implanted collector) layer 6, and a collector wall 7. The Si epitaxially grown layer 2 is formed on the Si substrate 1 by epitaxial growth. The deep trench isolations 3 are formed across the boundary between the Si epitaxially grown layer 2 and the Si substrate 1. The shallow trench isolation 4 is formed in the Si epitaxially grown layer 2. The buried $N^+$ layer 5, which contains an n-type impurity (such as arsenic (As)) at a high concentration, is formed across the boundary between the Si substrate 1 and the Si epitaxially grown layer 2. The SIC layer 6, which is in contact with the buried $N^+$ layer 5, is formed by implanting ions of an n-type impurity (such as phosphorus (P)) into the Si epitaxially grown layer 2. Formed on a collector layer located within the Si epitaxially grown layer 2 over the SIC layer 6 is an emitter/base stacked portion 20 obtained by stacking SiGeC and Si layers. This schematic structure of the SiGeC-HBT has been conventionally known.

Hereafter, characteristics of the SiGeC-HBT according to this embodiment will be described. As shown enlarged in the upper right of FIG. 1A, the emitter/base stacked portion 20 includes a SiGeC spacer layer 21, a SiGeC core base layer 22, a SiGe cap layer 23, a Si cap layer 24, and an emitter layer 25. The SiGeC spacer layer 21 is epitaxially grown on the Si epitaxially grown layer 2 (the collector layer). The SiGeC core base layer 22, which contains boron at a high concentration, is epitaxially grown on the SiGeC spacer layer 21. The SiGe cap layer 23 is epitaxially grown on the SiGeC core base layer 22. The Si cap layer 24 is formed on the SiGe cap layer 23. The emitter layer 25 is formed by introducing an n-type impurity, for example, phosphorus (P) into the Si cap layer 24 and the SiGe cap layer 23 (or into only the Si cap layer 24).

FIG. 1B shows a specific structure of the emitter/base stacked portion 20 in the SiGeC-HBT shown in the upper right of FIG. 1A. In FIG. 1B, the abscissa represents the depth from the upper surface of the Si cap layer 24, and the ordinate represents the Ge content (indicated by the solid line), the C content (indicated by the dashed line), and the B (boron) concentration (indicated by the dotted-dashed line), wherein the units (atoms/cm$^3$) used to express the boron concentration are different from the units (%) in which the Ge and C contents are expressed.

As indicated in FIG. 1B, the Ge content profile shows that the Ge content is substantially constant (about 25%) in the SiGeC spacer layer 21 and is graded in the SiGeC core base layer 22. Specifically, in the SiGeC core base layer 22, the Ge content is the same (about 25% in this embodiment) as in the SiGeC spacer layer 21 at the end portion that contacts the SiGeC spacer layer 21, and is the same (about 15% in this embodiment) as in the SiGe cap layer 23 at the end portion that contacts the SiGe cap layer 23. The C content profile shows that the C content is constant (about 0.8%) at a higher level in the SiGeC spacer layer 21 and the SiGeC core base layer 22 as compared to the SiGeC core base layer in the known SiGeC-HBT.

As described above, the characteristics of the present invention are that in the emitter/base stacked portion 20, the cap layer (hereinafter which will be referred to as a "direct-on cap layer") provided directly on and in contact with the SiGeC core base layer is formed from not the Si cap layer but the SiGe cap layer 23 unlike the known device, and the C content in the SiGeC core base layer 22 is high. However, a SiGeC cap layer may be formed instead of the SiGe cap layer 23. Specifically, when the composition of the SiGeC core base layer 22 is expressed by $Si_{1-x1-y1}Ge_{x1}C_{y1}$ and the composition of the SiGe cap layer 23 (or the SiGeC cap layer) is expressed by $Si_{1-x2-y2}Ge_{x2}C_{y2}$, the following conditions may hold.

$$0<x1<1, 0.003<y1<1$$

$$0<x2<1, 0.003 \leq y2<1$$

Further, as in the known SiGeC-HBT, an external base layer 11 is provided on the emitter/base stacked portion 20 laterally, and an insulating layer 13 and an emitter electrode 12 are provided on the emitter/base stacked portion 20. The insulating layer 13 surrounds an opening for the emitter, and the emitter electrode 12 is surrounded by the insulating layer 13 and in contact with the emitter layer 25 at the opening for the emitter. The emitter electrode 12 is made of polysilicon containing a high concentration of an n-type impurity, for example, phosphorus (P). The emitter layer 25 is formed by heat-treating the phosphorous (P) existing in the emitter electrode 12 to diffuse it into the Si cap layer 24 (or the Si cap layer 24 and the SiGe cap layer 23). In addition, the upper portions of the collector wall layer 7 and the emitter electrode 12 are silicide layers 7a and 12a, respectively.

Process Steps for Fabricating SiGeC-HBT

Figure 2A:
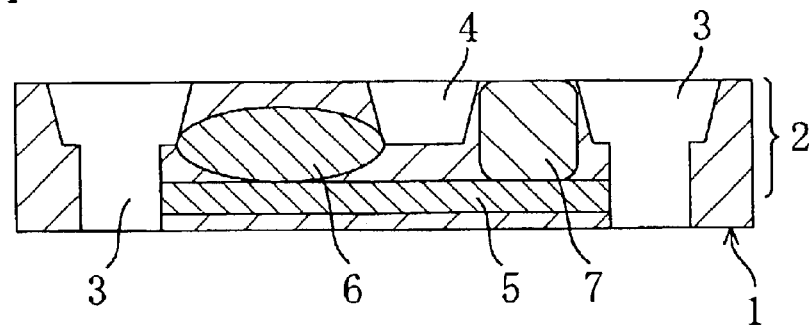
FIGS. 2A through 2C are cross-sectional views illustrating process steps for fabricating the SiGeC-HBT of the first embodiment.
Figure 2B:
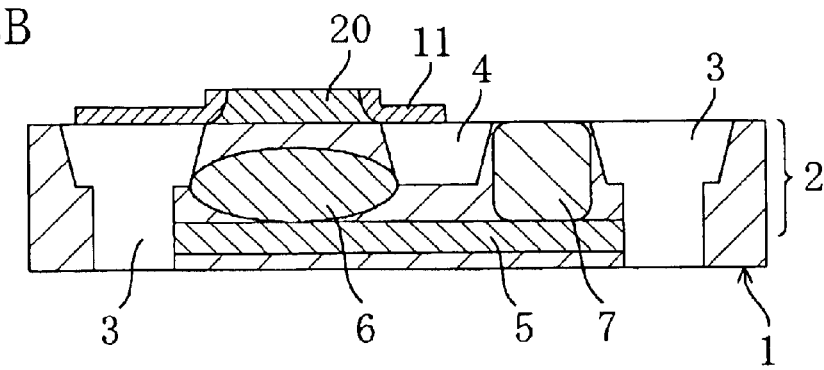
Figure 2C:
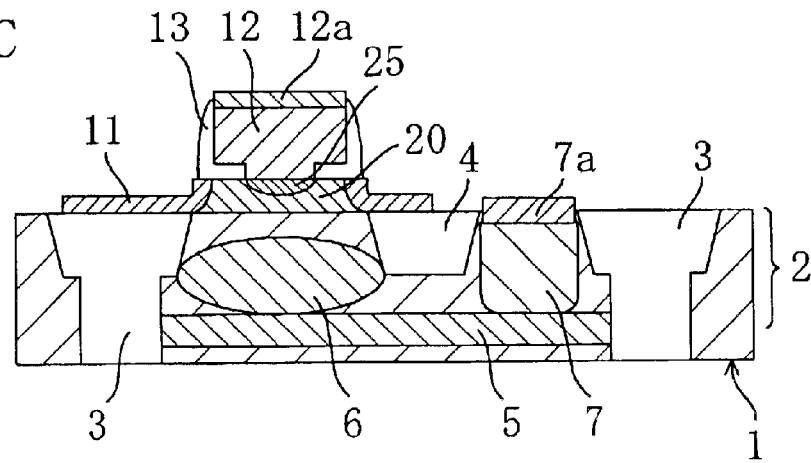

FIGS. 2A through 2C are cross-sectional views illustrating process steps for fabricating the SiGeC-HBT of this embodiment.

In the process step shown in FIG. 2A, ions of an n-type impurity (such as arsenic (As)) are implanted into part of the Si substrate 1 at a high concentration, thereby forming the buried N+ layer 5. A Si crystal is then epitaxially grown on the Si substrate to form the Si epitaxially grown layer 2. Thereafter, shallow trenches are formed in the Si epitaxially grown layer 2, and some of the shallow trenches are then formed into deep trenches, which go through the Si epitaxially grown layer 2 to extend into the Si substrate 1. Following this, the lateral faces of the deep trenches are oxidized and the deep trenches are filled with polysilicon, thereby forming the deep trench isolations 3. An oxide film is filled in the shallow trenches that are not formed into deep trenches, thereby forming the shallow trench isolations 4. Thereafter, in order to increase the device performance by obtaining a retro-grade collector profile by lowering the collector resistance, the SIC layer 6 is formed in the Si epitaxially grown layer 2 by implanting ions of phosphorous (P).

Subsequently, in the process step shown in FIG. 2B, the SiGeC spacer layer 21 of a thickness of 25 nm, the SiGeC core base layer 22 of a thickness of 20 nm, the SiGe cap layer 23 of a thickness of 20 nm, and the Si cap layer 24 of a thickness of 10 nm are formed on the Si epitaxially grown layer 2 by UHV-CVD. In other words, the emitter/base stacked portion 20 shown in the upper right of FIG. 1A is formed. The SiGeC spacer layer 21 is made of 25% content Ge, 0.8% content C, and Si occupying the remainder. The SiGeC core base layer 22, which is doped with boron (B) at a concentration of $1.4 \times 10^{19}$ atoms/cm$^3$, is made of Ge whose content grades from 25% to 15%, 0.8% content C, and Si occupying the remainder. The SiGe cap layer 23 is made of 15% content Ge and Si occupying the remainder. Further, when the SiGeC layers are epitaxially grown, the external base layer 11 is simultaneously formed on the emitter/base stacked portion 20 laterally.

Note that carbon acts effectively to a certain degree when contained in the SiGeC core base layer 22 at a concentration of 0.3% or higher instead of 0.8%.

Then, in the process step shown in FIG. 2C, a polysilicon film containing phosphorus (P) at a concentration of about $3 \times 10^{20}$ atoms/cm$^3$ is deposited over the substrate. RTA treatment is then carried out at 910° C. so as to diffuse phosphorous in the polysilicon, thereby forming the emitter electrode 12. While the Co silicide layers 7a and 12a are formed, for example, for attaining reduced resistance, wire is formed. A native oxide film formed during the deposition of the polysilicon film is present between the emitter electrode 12 and the Si cap layer 24 that is the uppermost portion of the emitter/base stacked portion 20. The thickness of the native oxide film is ununiform, which causes variations in the base current, that is, variations in the current gain.

Detailed Structure of SiGeC-HBT

Figure 3A:
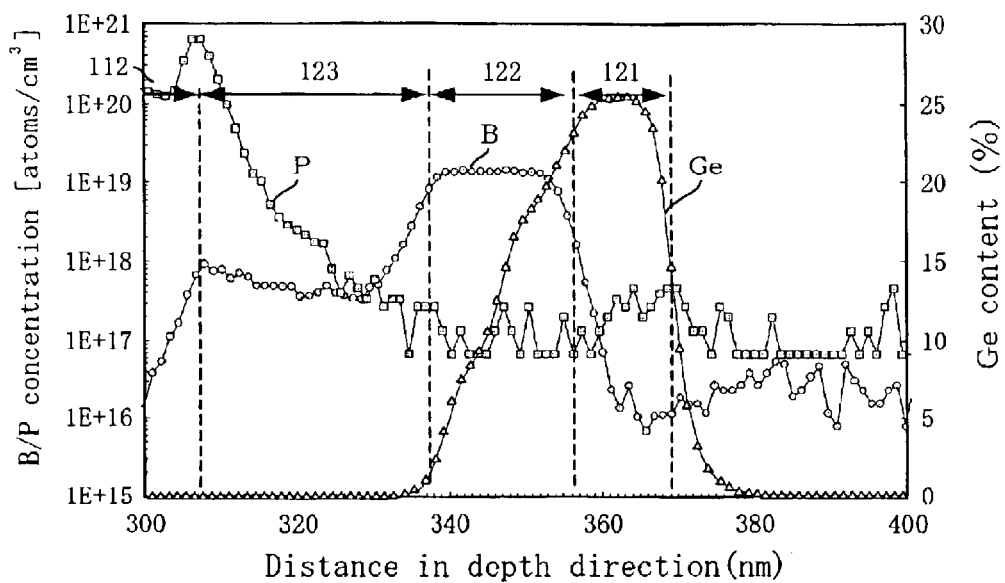
FIG. 3A is a graph showing data from analysis of profiles of Ge content and B and P concentration in an emitter electrode and an emitter/base stacked portion 20 in a known structure.
Figure 3B:
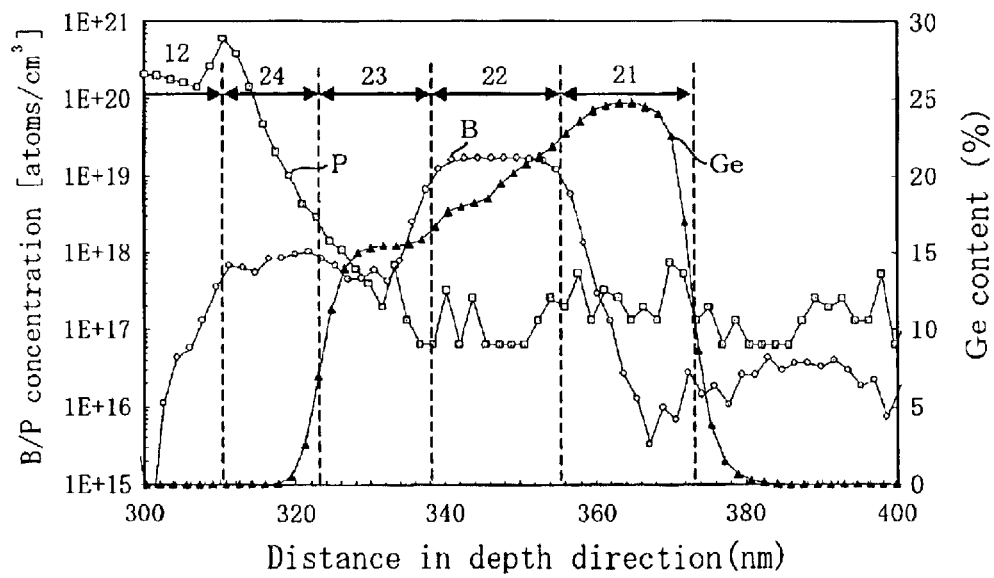
FIG. 3B is a graph showing data from analysis of profiles of Ge content and B and P concentration in an emitter electrode and an emitter/base stacked portion 20 in the structure in accordance with the first embodiment.

FIGS. 3A and 3B are graphs comparatively showing data from SIMS analysis of the profiles of Ge content and B and P concentration in an emitter electrode and an emitter/base stacked portion. FIG. 3A shows the data for the known structure and FIG. 3B shows the data for the structure in accordance with this embodiment. In FIGS. 3A and 3B, the abscissa represents the lengthwise distance from the emitter electrode of polysilicon, and the ordinates represent the Ge content (%), and the B and P concentrations (atoms/cm$^3$), respectively.

As shown in FIG. 3A, the SiGeC spacer layer 121 contains Ge of about 25% uniformly and the SiGeC core base layer 122 contains Ge whose content grades. Further, the emitter electrode 112 contains phosphorus (P) at a concentration of about $3 \times 10^{20}$ atoms/cm$^3$. The emitter layer 125 contains phosphorus which has been diffused from the emitter electrode 112 and whose concentration grades so as to gradually decrease in the downward direction. The SiGeC core base layer 122 contains phosphorus diffused from the emitter electrode 112 at a concentration of about $5 \times 10^{17}$ atoms/cm$^3$ and boron (B) at a concentration of about $1.4 \times 10^{19}$ atoms/cm$^3$. With such impurity distribution, a p/n junction is formed between the emitter and the base in the known SiGeC-HBT disclosed in the foregoing article.

As shown in FIG. 3B, on the other hand, the SiGeC spacer layer 21 in this embodiment contains Ge of about 25% uniformly, the SiGe cap layer 23 contains about 15% content Ge, and the SiGeC core base layer 22 contains Ge whose content grades. Further, the emitter electrode 12 contains phosphorus (P) at a concentration of about $3 \times 10^{20}$ atoms/cm$^3$. Parts of the emitter layer 25 and the SiGe cap layer 24 contain phosphorus which has been diffused from the emitter electrode 12 and whose concentration grades so that the concentration gradually decreases in the downward direction. The SiGeC core base layer 22 contains phosphorus diffused from the emitter electrode 12 at a concentration of about $5 \times 10^{17}$ atoms/cm$^3$ and boron (B) at a concentration of about $1.4 \times 10^{19}$ atoms/cm$^3$. With such impurity distribution, a p/n junction is formed between the emitter and the base in the known SiGeC-HBT disclosed in the foregoing article.

In both of FIGS. 3A and 3B, the p/n junction appears at 330 nm on the abscissa. The p/n junction exists in the Si cap layer 123 in the known SiGeC-HBT shown in FIG. 3A, whereas the p/n junction exists in the SiGe cap layer 23 (with a 15% content Ge) in the SiGeC-HBT of this embodiment shown in FIG. 3B.

Although not shown in FIGS. 3A and 3B, about 0.1% carbon (C) is contained in the known SiGeC core base layer 122 and the SiGeC spacer layer 121. In this embodiment, on the other hand, about 0.8% carbon (C) is contained in the SiGeC core base layer 22 and the spacer layer 21.

It should be noted that the cap layer is doped with boron (B) at about $1 \times 10^{18}$ atoms/cm$^3$ in each SiGeC-HBT because this works to suppress recombination current in the vicinity of the emitter/base junction, thereby increasing the linearity of the SiGeC-HBT.

Further, in the emitter/base stacked portion 20 in this embodiment, the SiGeC spacer layer 21 is provided below the SiGeC core base layer 22 doped with a high concentration of boron, that is, on the base/collector junction side. The SiGeC spacer layer 21 is provided to prevent the boron introduced into the SiGeC core base layer 22 from diffusing through the SiGeC/Si interface into the collector layer within the Si epitaxially grown layer 2 and causing formation of a parasitic barrier that would otherwise lead to decrease in the device performance.

"Parasitic barrier" means a potential barrier that is created at a SiGeC/Si interface on the Si side because a Si layer (the collector layer in the Si epitaxially grown layer 2 in this embodiment) contacting a SiGeC or SiGe layer (the core base layer in this embodiment) becomes p-type due to the diffused boron and the bandgap of Si is larger than that of SiGe. The existence of the potential barrier, which interferes with transition of electrons, reduces the device performance greatly.

The Si cap layer 24 is provided to adjust the distance between the region where P from the emitter electrode 12 is diffused at a high concentration and the SiGeC core base layer 22 and to protect the SiGe surface against exposure during the process step. However, the Si cap layer 24 is not necessarily needed.

Functions and Effects of Present Invention Shown in Data

In the SiGeC-HBT of this embodiment, the Ge profile is graded in the SiGeC core base layer 22 such that the Ge content is increased heading toward the collector side. Thus, the potential of the conduction band $E_c$ of the SiGeC core base layer 22 decreases gradually in the direction heading from the emitter side to the collector side. Accordingly, electrons passing through the base can be accelerated so as to reach the collector quickly, allowing increase in operating speed of the device. Further, the bandgap $E_g$ becomes smaller because the SiGeC core base layer 22 contains Ge. Therefore, even if a voltage $V_{be}$ applied between the base and the emitter is lower, the collector current $I_c$ flows in a large amount such that the base current $I_b$ decreases relatively and the current gain $h_{FE}$ can increase. As a result, the typical effects of a SiGe hetero-bipolar transistor (SiGe-HBT) can be exhibited. Specifically, even if the concentration of an impurity (such as boron) is increased in the core base layer, the current gain $h_{FE}$ does not decrease that much. Thus, with the current gain $h_{FE}$ kept at a high level, the base resistance can be reduced. In the SiGeC-HBT of the present invention, however, the SiGeC core base layer 22 does not necessarily have to have a graded Ge content.

Also, since the SiGeC core base layer 22 contains carbon (C), boron diffusion can be controlled in the core base layer. Thus, the boron can be confined at a high concentration in the SiGeC core base layer 22 having a small width even after heat treatment has been carried out. In other words, as a result of the control of the boron diffusion in the SiGeC core base layer 22, the boron concentration in the SiGeC core base layer 22 can be kept as high as $1.4 \times 10^{19}$ atoms/cm$^3$. This effect can also be exhibited in the known SiGeC-HBT.

Figure 14A:
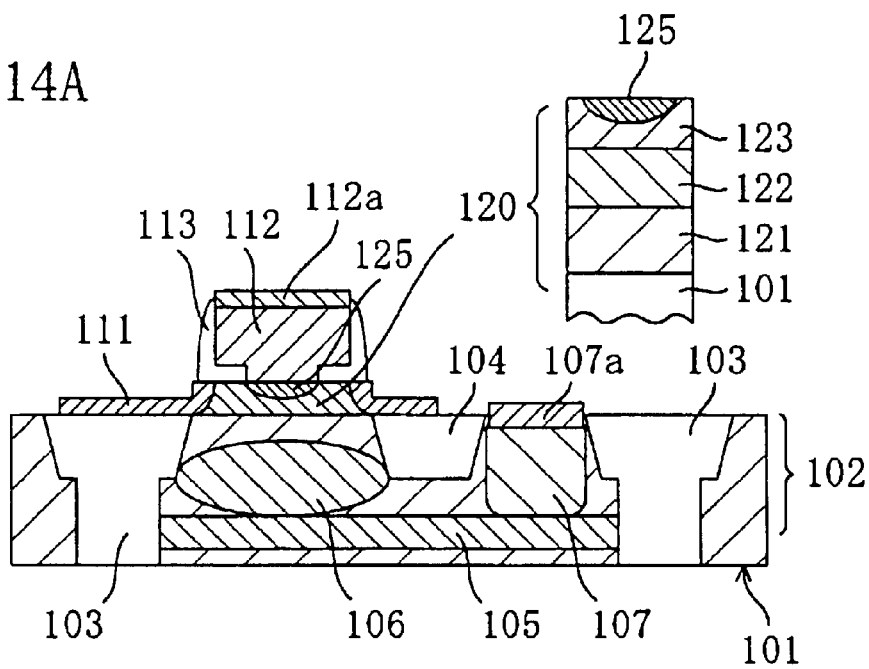
FIG. 14A is a cross-sectional view schematically illustrating an exemplary structure of a known SiGeC-HBT.
Figure 14B:
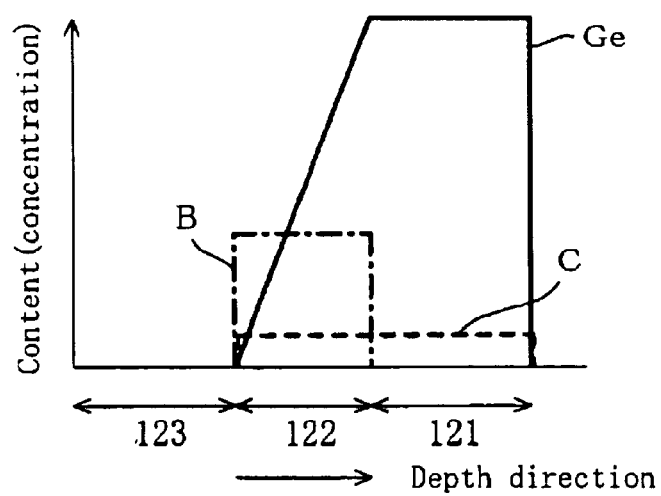
FIG. 14B is a graph showing profiles of Ge content, C content and impurity concentration in an emitter/base stacked portion therein.
Figure 15:
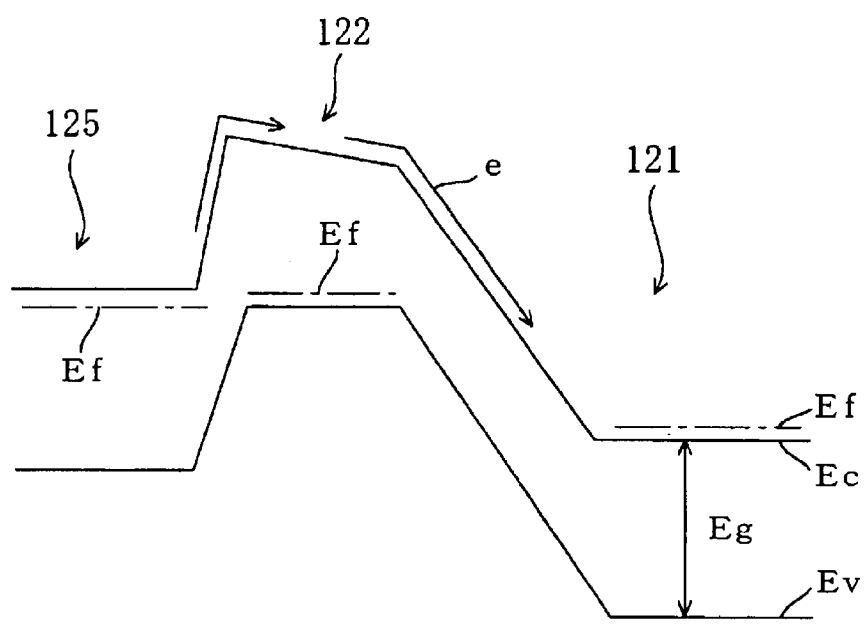
FIG. 15 is a diagram illustrating an energy band in a longitudinal section passing through the emitter/base junction in a SiGeC-HBT having the structure shown in FIG. 14B.

When a comparison is made between the impurity profile in the emitter/base stacked portion 20 in this embodiment shown in FIG. 1B and the impurity profile in the known HBT shown in FIG. 14B, the carbon content (C content) of the SiGeC core base layer 22 in this embodiment shown in FIG. 1B is as high as 0.8%, while the C content of the known SiGeC core base layer 122 shown in FIG. 14B is 0.1%. This is one of the characteristics of the SiGeC-HBT of the present invention.

Figures 4, 5:
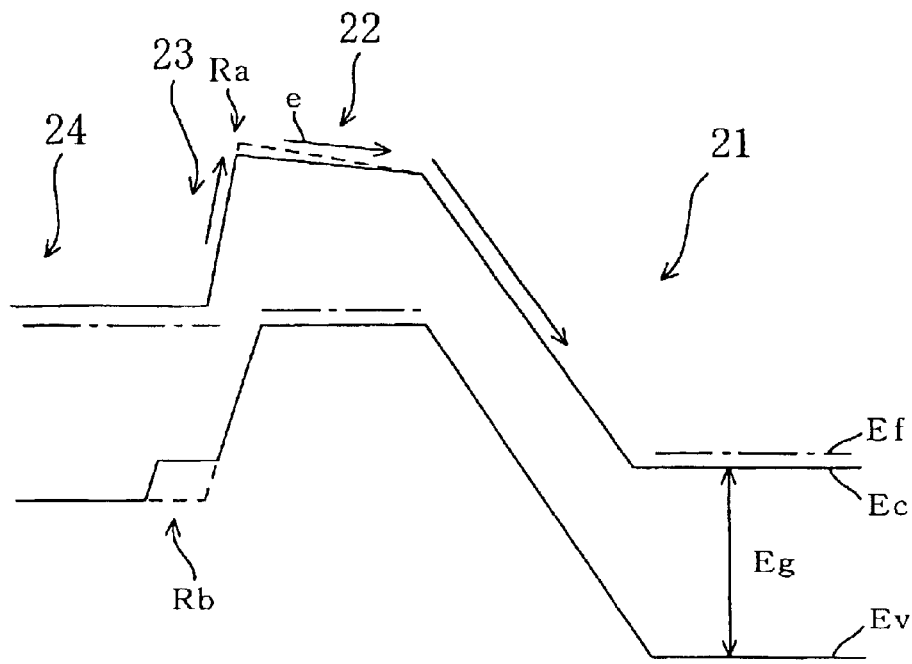
FIG. 4 is an energy-band diagram for schematically illustrating the band structure of the SiGeC-HBT of the first embodiment.
FIG. 5 is a table showing the current gain $h_{FE}$ and variations in the current gain $h_{FE}$ in SiGeC-HBTs having different compositions in parts thereof

FIG. 4 is an energy-band diagram for schematically illustrating the band structure of the SiGeC-HBT of this embodiment. In FIG. 4, the band structure of the known SiGeC-HBT in which only the Si cap layer is provided on the SiGeC core base layer is indicated by the dashed line. As shown in FIG. 4, in the SiGeC-HBT of this embodiment, the SiGe cap layer 23 is provided directly on the SiGeC core base layer 22. In other words, the direct-on cap layer is a SiGe cap layer. Therefore, a potential barrier between the emitter and the base is reduced and thus the collector current $I_c$ can easily flow in from the emitter to the base. At this point, since the potential barrier is reduced by about 7.5 meV every percent Ge in the composition, the increase in the Ge content of the cap layer from 0% to 15% results in a reduction of 112.5 meV in the potential barrier in the SiGeC-HBT of this embodiment compared to the known SiGeC-HBT.

Therefore, in the SiGeC-HBT of this embodiment, a direct-on cap layer is formed from a SiGe layer and thereby the collector current $I_c$ is increased. This effect can be achieved if part of the SiGe cap layer 23 exists in a depletion layer which has a built-in potential and is located between the emitter and the base.

FIG. 5 is a table showing the current gain $h_{FE}$ and variations in the current gain $h_{FE}$ in SiGeC-HBT samples having different compositions in parts thereof. As shown in FIG. 5, in Sample 1, 0.2% of carbon (C) is contained in the SiGeC core base layer and the cap layer (the direct-on cap layer) located directly on the SiGeC core base layer is a Si cap layer. In Sample 2, 0.8% of carbon (C) is contained in the SiGeC core base layer and the direct-on cap layer is a Si cap layer. In Sample 3, 0.8% of carbon (C) is contained in the SiGeC core base layer and the direct-on cap layer is a SiGe cap layer containing 8% of Ge. In Sample 4, 0.2% of carbon (C) is contained in the SiGeC core base layer and the direct-on cap layer is a SiGe cap layer containing 15% of Ge. In Sample 5, 0.5% of carbon (C) is contained in the SiGeC core base layer and the direct-on cap layer is a SiGe cap layer containing 15% of Ge. And in Sample 6, 0.8% of carbon (C) is contained in the SiGeC core base layer and the direct-on cap layer is a SiGe cap layer containing 15% of Ge.

FIG. 5 shows that among these samples, Samples 5 and 6, each of which includes the SiGe cap layer as the direct-on core base layer and whose C content in the SiGe core base layer is 0.5% and 0.8%, respectively, have the smallest variations in the current gain $h_{FE}$. The variations in the current gain $h_{FE}$ in Samples 5 and 6 are particularly small, i.e., 19.9% and 24.3%, respectively, whereas the variations in the current gain $h_{FE}$ are about 35 to 65% in the other samples. Further, a comparison between Samples 3 and 6 shows that variations in the current gain $h_{FE}$ are smaller in one in which the SiGe cap layer has a higher Ge content than the other one even when Samples 3 and 6 have the same C content of the SiGe cap layer.

Figure 6:
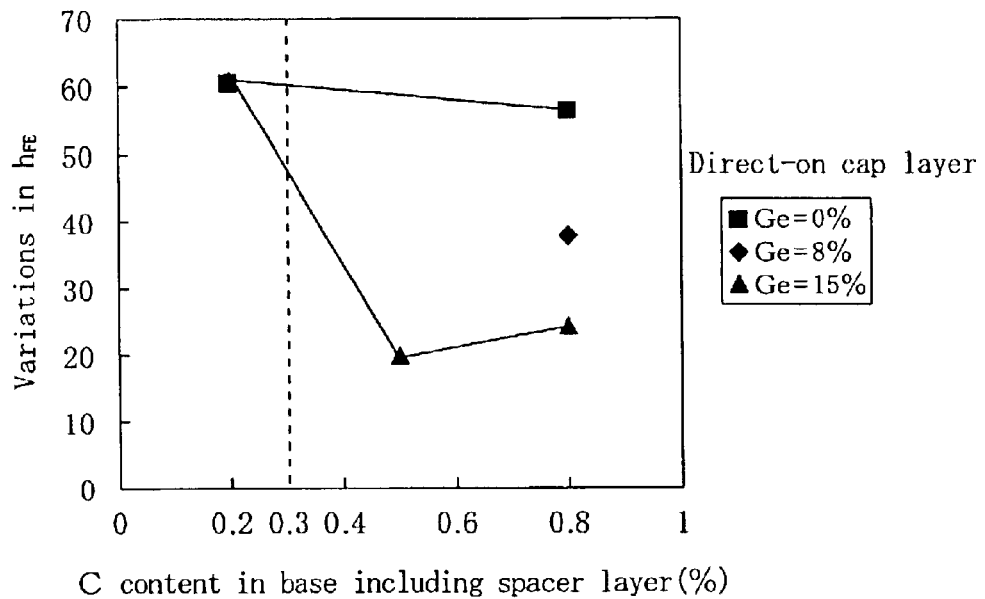
FIG. 6 is a graph showing how variations in the current gain $h_{FE}$ vary among SiGeC-HBTs according to C content of SiGeC core base layer therein, by using Ge content of direct-on cap layer as a parameter.

FIG. 6 is a graph showing how the variations in the current gain $h_{FE}$ vary among the SiGeC-HBT samples according to the C content of the SiGeC core base layer therein, by using the Ge content of the direct-on cap layer as a parameter. The following is what can be seen from FIGS. 5 and 6.

In the SiGeC-HBTs including a Si cap layer as the direct-on cap layer, variations in the current gain $h_{FE}$ are large regardless of the C content of the SiGeC core base layer. In contrast, in the SiGeC-HBTs including a SiGe cap layer as the direct-on cap layer, there is the tendency that the higher the C content of the SiGeC core base layer is, the smaller the variations in the current gain $h_{FE}$ is. In such cases, when the C content of the SiGeC core base layer is 0.3% or more, the variations in the current gain $h_{FE}$ are markedly reduced. Therefore, the C content of the SiGeC core base layer is preferably 0.3% or more.

Although not shown in FIGS. 5 and 6, from experiments on samples that the present inventors made, it is evident that when the C content of a SiGeC core base layer exceeds 1.5% (0.015 in mole fraction), the crystallinity of the SiGeC core base layer deteriorates, resulting in decrease in operating speed of the SiGeC-HBT. The C content in the SiGeC core base layer is thus preferably about 1.5% or less.

However, even when SiGeC-HBTs have the same C content of the SiGeC core base layer, the current gain $h_{FE}$ is greater in SiGeC-HBTs including a SiGe cap layer as the direct-on cap layer than in SiGeC-HBTs including a Si cap layer as the direct-on cap layer. At the same time, variations in the current gain $h_{FE}$ are smaller in the SiGeC-HBTs including a SiGe cap layer as the direct-on cap layer than in the SiGeC-HBTs including a Si cap layer as the direct-on cap layer. That is to say, greater effects can be obtained in the SiGeC-HBTs in which the SiGe cap layer with a Ge content of 8% or more is formed. However, when the SiGe cap layer that is the direct-on cap layer having a thickness of 50 nm has a Ge content of over 40%, the crystallinity might deteriorate. Therefore, the Ge content of the SiGe cap layer is preferably 40% or less.

Alternatively, a SiGeC cap layer can be provided in place of the SiGe cap layer as the direct-on cap layer.

Examination of Other Characteristics of SiGeC-HBT

Figure 7:
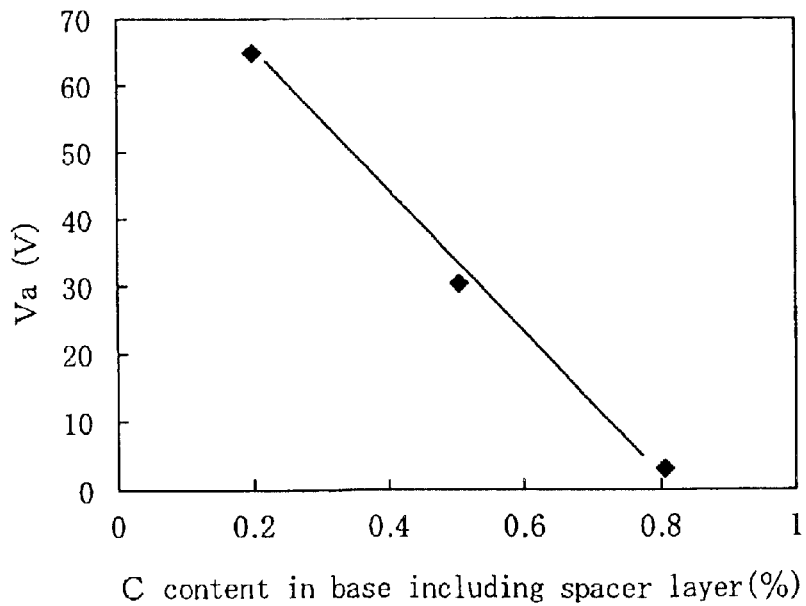
FIG. 7 is a graph showing how early voltage $V_a$ varies according to C content of base layer including a spacer.

FIG. 7 is a graph showing how the early voltage $V_a$ varies in accordance with the C content of a base layer including a spacer. It is known that when an core base layer contains carbon (C) in large quantity, the early voltage $V_a$ normally decreases as the C content increases. This is presumably because when the base layer contains a large quantity of carbon (C), carbon forms a recombination center in a depletion layer at the collector/base junction (the CB junction), resulting in increase in recombination current. Because it is desirable that the early voltage $V_a$ be high, as shown in FIG. 7, to make the early voltage $V_a$ 10 V or more in a practicable transistor, it is preferable that the C content in the SiGeC spacer layer be 0.7% or less, for example.

Principles on How the Effects of the Present Invention are Achieved

Hereinafter, the principles on how the above-described effects can be achieved owing to the C content of the SiGeC core base layer and the composition of the direct-on cap layer according to the present invention will be examined.

Figure 8A:
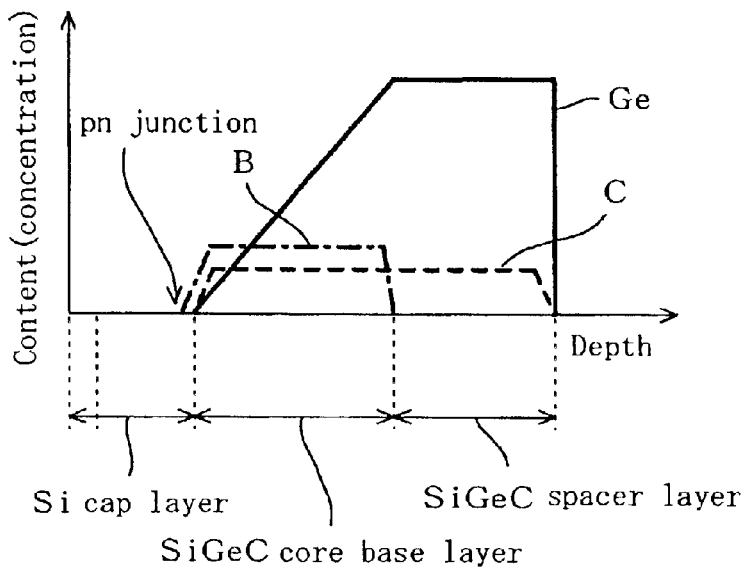
FIG. 8A is a graph showing profiles of Ge content, C content and of impurity concentration in an emitter/base stacked portion in Sample 2.
Figure 8B:
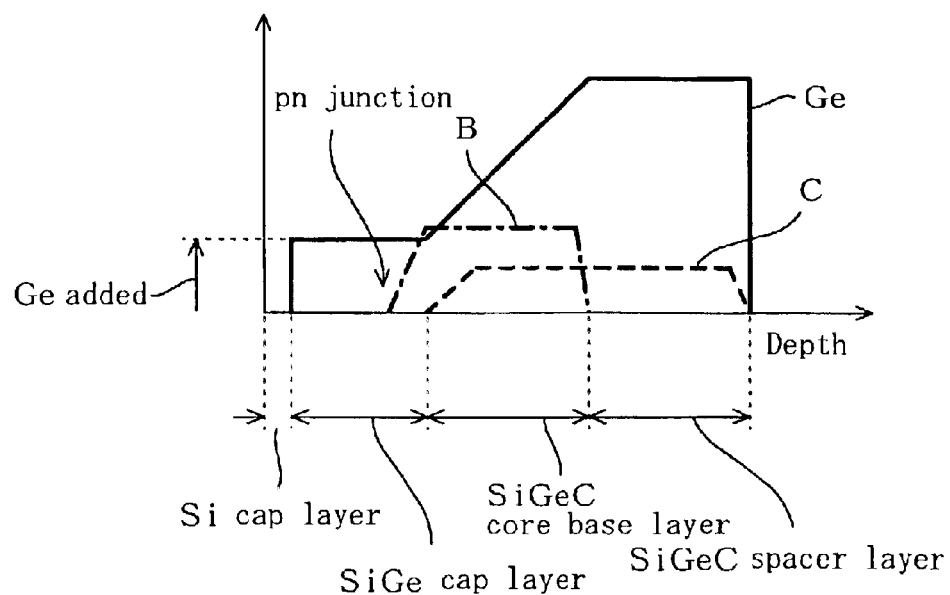
FIG. 8B is a graph showing profiles of Ge content, C content and impurity concentration in an emitter/base stacked portion in Sample 4.

FIGS. 8A and 8B are graphs showing the profiles of the Ge content, C content and impurity concentration in the emitter/base stacked portion in Samples 2 and 4 of FIG. 5, respectively. In the structure of the emitter/base stacked portion shown in FIG. 8A, a p/n junction is formed in the Si cap layer. In the structure of the base/emitter stacked portion shown in FIG. 8B, a p/n junction is formed in the SiGe cap layer.

Figure 9:
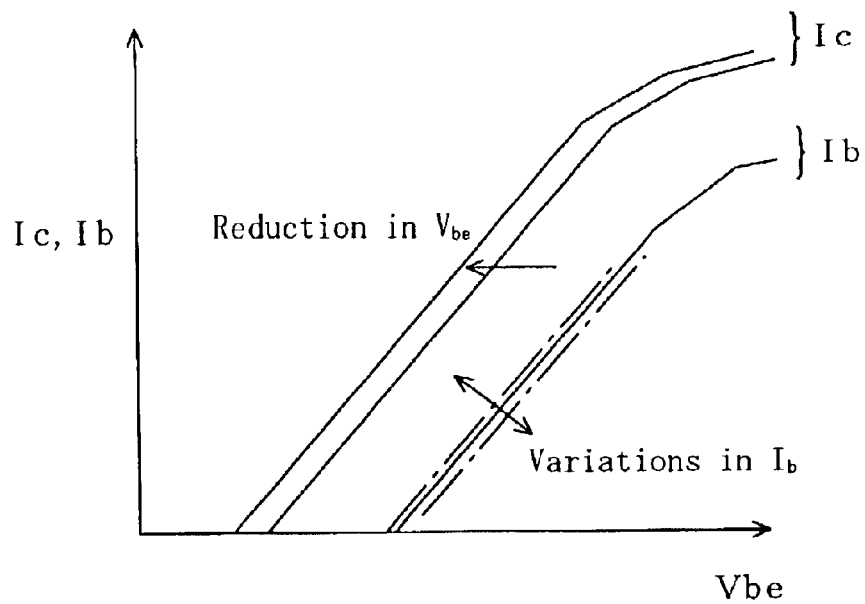
FIG. 9 is a graph showing how Gummel characteristics vary when a SiGe cap layer is used in place of a Si cap layer as a direct-on cap layer provided directly on the emitter/base stacked portion in the SiGeC-HBT with C content of SiGeC core base layer unchanged.

FIG. 9 is a graph showing how Gummel characteristics vary when a SiGe cap layer is used in place of a Si cap layer as a direct-on cap layer (i.e., a cap layer provided directly on and in contact with a SiGeC core base layer) provided directly on the emitter/base stacked portion in the SiGeC-HBT with the C content of the SiGeC core base layer unchanged. As shown in FIG. 9, the collector current $I_c$ is increased by using as the direct-on cap layer the SiGe cap layer in place of the Si cap layer. In other words, by using as the direct-on cap layer the SiGe cap layer in place of the Si cap layer, a base/emitter voltage $V_{be}$ for obtaining a predetermined $I_c$ is reduced. This effect occurs if part of the SiGe cap layer exists in a depletion layer which has a built-in potential between the emitter and the base. This allows a bipolar transistor (which is the SiGeC-HBT in this embodiment) to operate at low voltage.

On the other hand, since the base current $I_b$ is not varied by using as the direct-on cap layer the SiGe cap layer in place of the Si cap layer, the variations in the base current $I_b$ are not varied. Because of the fact that changes in the base current $I_b$ is a principal cause of variations in the current gain $h_{FE}$, as shown in FIG. 8B, it is presumably difficult to greatly reduce variations in the current gain $h_{FE}$ only by using as the direct-on cap layer a SiGe cap layer in place of a Si cap layer.

Figure 10:
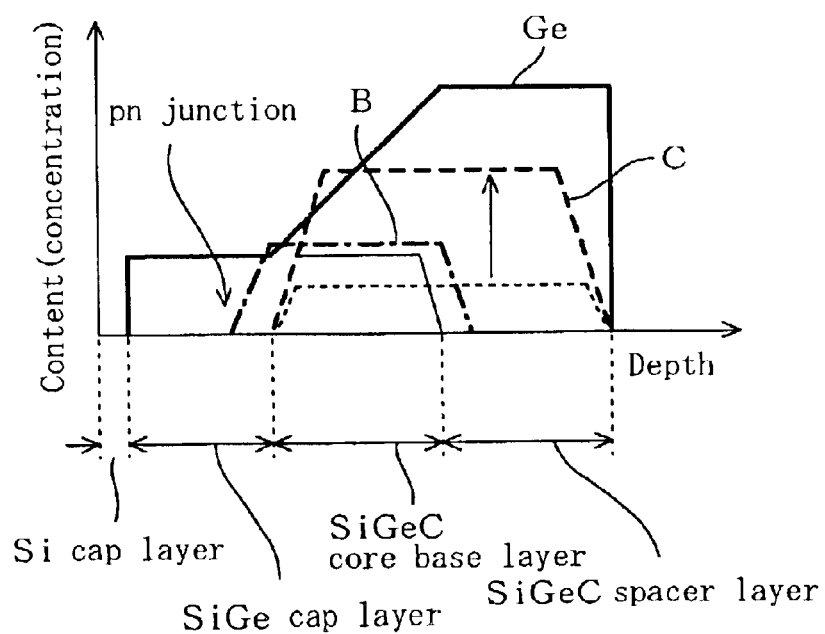
FIG. 10 is a graph showing profiles of Ge content, C content and impurity concentration in an emitter/base stacked portion with an increased C content of SiGeC core base layer.

Then, as shown in FIG. 10, it was experimentally confirmed that variations in the base current $I_b$ can be reduced by increasing the carbon (C) content of the SiGeC core base layer from a value (e.g., 0.1 through 0.2%) indicated by the dotted line to another value (e.g., 0.3% or higher) indicated by the solid line. Although the principles behind the reduction in the base-current $I_b$ variations have not been elucidated sufficiently, the reduction is an experimental fact, as shown in FIG. 5. The present inventors' thinking concerning the principles is as follows.

Figure 11:
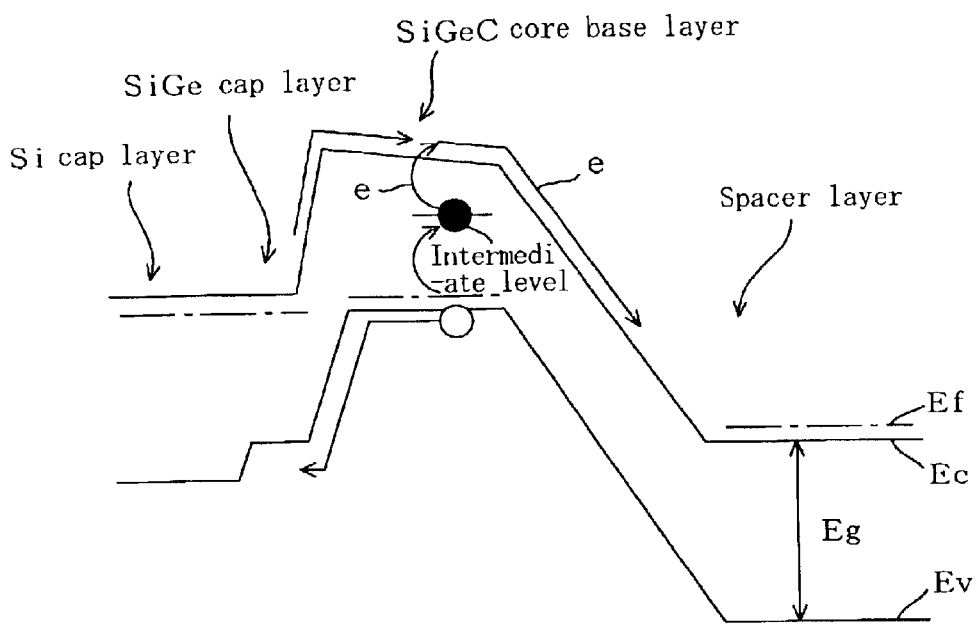
FIG. 11 is a view illustrating principles behind an increased base current due to increase in C content.

FIG. 11 is a view illustrating the principles, currently regarded as being relevant by the present inventors, behind the increased base current due to the increase in the C content. In a SiGeC crystal, as carbon (C) content increases, the number of carbons located at interstitial sites increases. Therefore, such an intermediate level as shown in FIG. 11 is easily caused. Electrons are thus likely to be excited to the conduction band $E_c$ via the intermediate level. As a result, holes are generated in the valence band $E_v$. In other words, the electrons flow heading from the SiGeC core base layer to the collector side through the intermediate level created due to the interstitial carbons, for example, and the holes that are produced at the same time flow to the emitter layer where they disappear through recombination. These are presumably the principles behind the increase in the base current $I_b$. In addition, since the SiGe cap layer having a small band gap is used in place of the Si cap layer as the direct-on cap layer, a base/emitter barrier in the valence band $E_v$ is reduced, thus allowing holes to flow in to the emitter layer easily.

In the first place, the variations in the base current value are due to the ununiform thickness of the native oxide film formed mainly near the interface between the Si cap layer and the polysilicon electrode (the emitter electrode) in the process step shown in FIG. 2B or 2C. Apart from whether the principles shown in FIG. 11 are correct or not, from the data (facts), it can be assumed that the increase in the base current $I_b$ obtained by the increase in the C content of the SiGeC core base layer is due to the hole flow that is hardly affected by the ununiform thickness of the native oxide film. Accordingly, the increase in the base current $I_b$ is determined by the C content in the SiGeC core base layer. When the increase in the base current $I_b$ due to the C content is larger than variation percentage in the base current $I_b$, the variations in the base current $I_b$ decrease sharply. As shown in FIG. 6, it is evident that the higher the C content of the SiGeC core base layer is, the smaller the variations in the current gain $h_{FE}$ are. When the C content of the SiGeC core base layer is 0.3% or higher, the variations in the current gain $h_{FE}$ decrease very notably.

Figure 12:
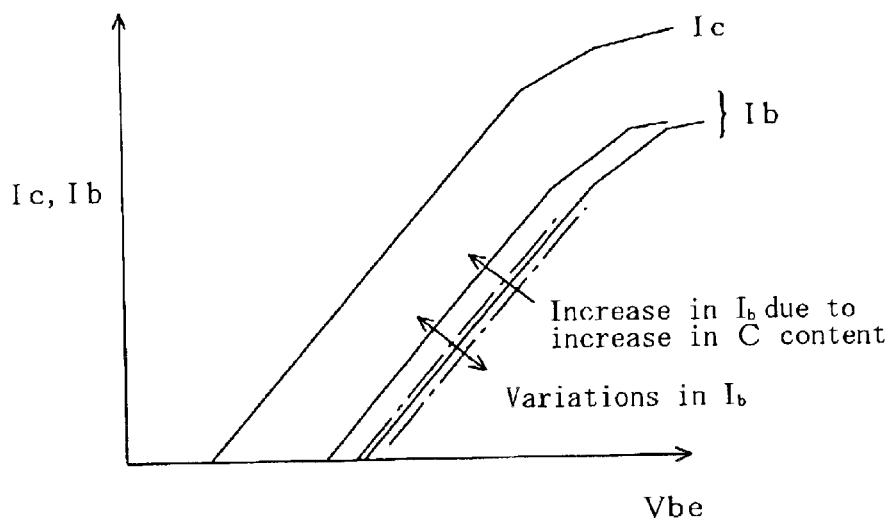
FIG. 12 is a graph showing how Gummel characteristics vary when a SiGe cap layer is used in place of a Si cap layer as a direct-on cap layer provided directly on the emitter/base stacked portion with an increased C content of the SiGeC core base layer.

FIG. 12 is a graph showing how Gummel characteristics vary when a SiGe cap layer is used in place of a Si cap layer as a direct-on cap layer provided directly on the emitter/base stacked portion in a SiGeC-HBT, with the increased C content of a SiGeC core base layer.

The base current $I_b$ is increased, as shown in FIG. 12, and then concerns arise about reduction in the current gain $h_{FE}$. However, when a SiGe cap layer is used in place of a Si cap layer as the cap layer (the direct-on cap layer) provided directly on the SiGeC core base layer, the collector current $I_c$ as well as the base current $I_b$ is increased. Accordingly, the current gain $h_{FE}$ is hardly reduced.

As can be understood from the above-described principles, when the direct-on cap layer is formed from not a SiGe cap layer but a SiGeC cap layer, barriers between the emitter and the base in the conduction band $E_c$ and between the base and the emitter in the valence band $E_v$ can be also reduced. Accordingly, the effects of the present invention can be achieved.

(Second Embodiment)

Figure 13:
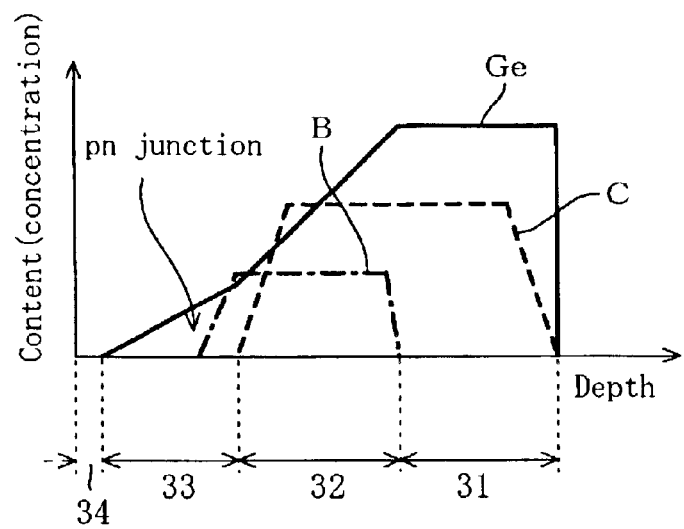
FIG. 13 is a diagram illustrating profiles of Ge content, C content and impurity concentration in an emitter/base stacked portion in a SiGeC-HBT according to a second embodiment of the present invention.

FIG. 13 is a diagram illustrating the profiles of Ge content, C content and impurity concentration in an emitter/base stacked portion in a SiGeC-HBT according to a second embodiment of the present invention. The cross-sectional structure of the SiGeC-HBT of this embodiment is basically the same as that shown in FIG. 1A and the structure of the emitter/base stacked portion is the same as that shown in the upper right of FIG. 1A. Specifically, in the emitter/base stacked portion in the SiGeC-HBT of this embodiment, a SiGeC spacer layer 31, a SiGeC core base layer 32, a graded SiGe cap layer 33, and a Si cap layer 34 are formed. The SiGeC spacer layer 31 has the same size and composition as the SiGeC spacer layer 21 of the first embodiment. The SiGeC core base layer 32 has the same size and composition as the SiGeC core base layer 22 of the first embodiment. The Si cap layer 34 has the same size and composition as the Si cap layer 24 of the first embodiment. In the graded SiGe cap layer 33, the profile of Ge content is not constant but is gradually reduced in the direction heading toward the emitter side. In this case, in the graded SiGe cap layer 33, the Ge content is 15% in the end portion that contacts the SiGeC core base layer 32 and is 0% in the end portion that contacts the Si cap layer 34.

In the SiGeC-HBT of this embodiment, a p/n junction between the emitter and the base is also created at a relatively high location where the Ge content is not 0% (e.g., where the Ge content is about 10%).

In the SiGeC-HBT of this embodiment, as in the SiGeC-HBT of the first embodiment, the two basic effects can be also achieved. Specifically, the base current $I_b$ is increased because of the SiGeC core base layer 32 containing C of 0.3% or more and the collector current $I_c$ is increased because of the cap layer (the direct-on cap layer) provided directly on the SiGeC core base layer 32 being the SiGe cap layer. Accordingly, variations in the current gain $h_{FE}$ can be reduced while maintaining the current gain $h_{FE}$ at a high level.

What is claimed is:

1. A semiconductor device comprising:
   a Si layer functioning as a collector layer and a semiconductor layer formed over the Si layer and functioning as an emitter layer and as a base layer,
   wherein the semiconductor layer includes:
   a core base layer whose composition is expressed by $Si_{1-x_1-y_1}Ge_{x_1}C_{y_1}$ (wherein $0<x_1<1$, $0.003 \leq y_1<1$), and
   a direct-on cap layer which is formed on and in contact with the core base layer and whose composition is expressed by $Si_{1-x_2-y_2}Ge_{x_2}C_{y_2}$ (wherein $0<x_2<1$, $0 \leq y_2<y_1$), said emitter layer formed in said direct-on cap layer.

2. The device of claim 1, wherein the C mole fraction $y_1$ in the core base layer is 0.003 or more to 0.015 or less.

3. The device of claim 1, wherein the Ge mole fraction $x_2$ in the direct-on cap layer is 0.08 or more.

4. The device of claim 1, further comprising an emitter electrode formed over the semiconductor layer and made of polysilicon.

5. The device of claim 1, wherein the semiconductor layer further includes a spacer layer which is interposed between the core base layer and the Si layer functioning as a collector layer and whose composition is expressed by $Si_{1-x_3-y_3}Ge_{x_3}C_{y_3}$ (wherein $0<x_3<1$, $0 \leq y_3<1$).

6. The device of claim 1, wherein the semiconductor layer further includes a Si cap layer that does not contain Ge formed on the direct-on cap layer, and
   wherein an emitter layer is formed in a region passing through the Si cap layer and extending into the direct-on cap layer.

7. The device of claim 1, wherein part of the direct-on cap layer is located in a depletion layer which has a built-in potential between the emitter and the base.

8. The device of claim 1, wherein the carbon concentration of the direct-on cap layer is substantially constant throughout the layer.

9. A semiconductor device comprising:
   a collector layer, a base layer formed over the collector layer and an emitter layer formed over the base layer,
   wherein the base layer and a region in contact with the base layer include silicon and germanium; the region is formed on the base layer; and the emitter layer is formed in the region, and
   the region further includes carbon and the base layer includes carbon.

10. The device of claim 9, wherein a germanium concentration of the region is 0.08 or more.

11. The device of claim 9, wherein the base layer further includes carbon.

12. The device of claim 9, wherein a carbon concentration of the base layer is 0.003 or more.

13. The device of claim 9, further comprising a spacer layer which includes silicon, germanium and carbon, and the spacer layer is interposed between the base layer and the collector layer.

14. The device of claim 9, wherein the carbon concentration of the region is substantially constant throughout the region.

15. The device of claim 9, wherein the collector layer is formed in a substrate.

16. The device of claim 9, wherein the collector layer is a Si layer.

* * * * *